United States Patent [19]

Scheerer et al.

[11] Patent Number: 5,066,955
[45] Date of Patent: Nov. 19, 1991

[54] ANALOG TO DIGITAL CONVERTERS WITH CONVERGENCE ACCELERATING SIGNALS

[76] Inventors: Joachim Scheerer, Am Fort Weisenau 38, 6500 Mainz 1; Hartmut Grützediek, An der Klosterheck 16, 6500 Mainz 43, both of Fed. Rep. of Germany

[21] Appl. No.: 544,682

[22] Filed: Jun. 27, 1990

[30] Foreign Application Priority Data

Jul. 4, 1989 [DE] Fed. Rep. of Germany ........ 3921976

[51] Int. Cl.$^5$ ............................................ H03M 1/50
[52] U.S. Cl. ..................................... 341/168; 341/166
[58] Field of Search ............... 341/168, 167, 166, 169, 341/170, 131, 129; 324/99 D; 364/829, 830

[56] References Cited

U.S. PATENT DOCUMENTS

| | | | |
|---|---|---|---|
| 3,765,012 | 10/1973 | Grützediek et al. | 340/347 NT |
| 3,942,174 | 3/1976 | Dorey et al. | 341/129 |
| 3,943,506 | 3/1976 | Peattie | 341/129 |
| 4,354,245 | 10/1982 | Delegue | 341/141 X |
| 4,361,831 | 11/1982 | Grützediek et al. | 340/347 NT |

OTHER PUBLICATIONS

A. Klauer & M. Pandit, "Processing Measurement Signals with High Resolution AD-Conversion", Nov. 1985, vol. 11, pp. 404–410, Technisches Messen.

*Primary Examiner*—A. D Pellinen
*Assistant Examiner*—Brian Young
*Attorney, Agent, or Firm*—Frishauf, Holtz, Goodman & Woodward

[57] ABSTRACT

Integrating analog to digital converter operating according to a multiple ramp procedure and having a charge storage or charge summation circuit which continuously up-integrates an input signal and which by means of a following comparator, a logic circuit and reference currents or reference voltages, down-integrates during periodically recurrent time intervals, the instants being defined by an oscillator, a timebase counter and a bistable stage. The time between two successive such instants being called a submeasurement. At the imput of the charge storage or charge summation circuit used for the input signal or at one its other inputs, convergence accelerating signals are superimposed after every nth (n=1,2,3,...) submeasurement to provide for strongly enhanced convergence range and for shorter convergence period, and these convergence accelerating signals having Taylor series expansions according to time in the time interval of a submeasurement which are first or higher order polynomials.

26 Claims, 13 Drawing Sheets

Fig.1a PRIOR ART - Block Diagram
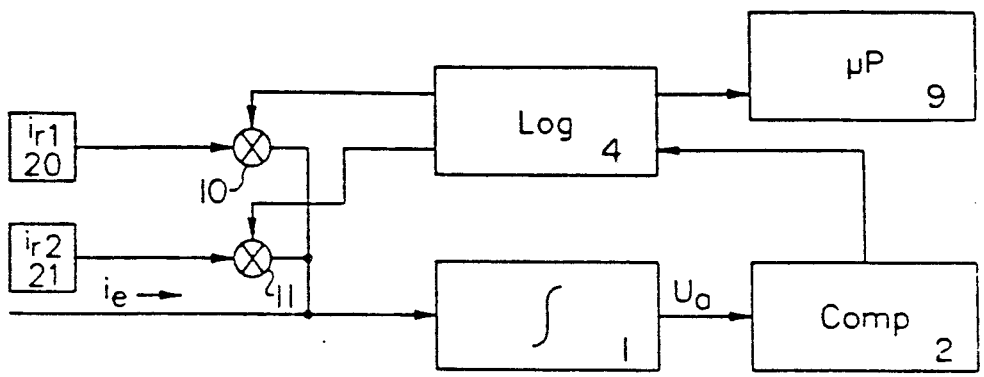
Fig.1b PRIOR ART - Timing Diagram for $i_{r1} = -1$; $i_{r2} = 0$
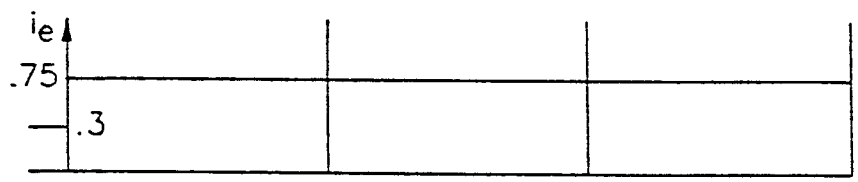
Fig.1c PRIOR ART - Timing Diagram for $i_{r1} = -1$ and $i_{r2} = 1$
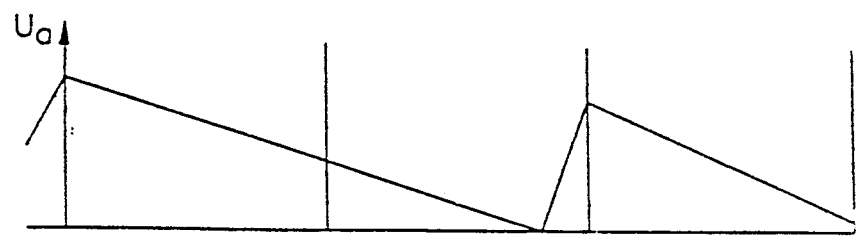

Fig.2a Block Diagram
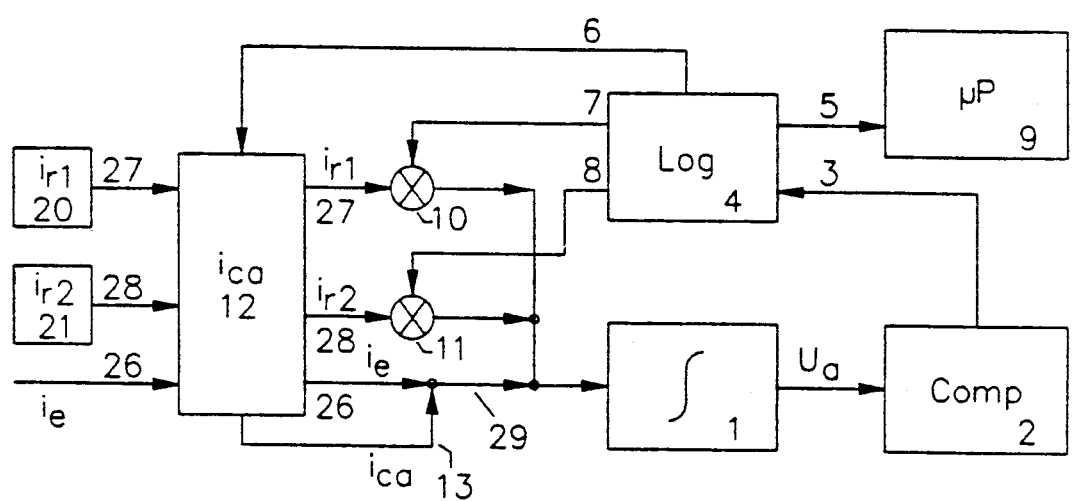

Fig.2b Timing Diagram for $i_{r1} = -1$ and $i_{r2} = 0$
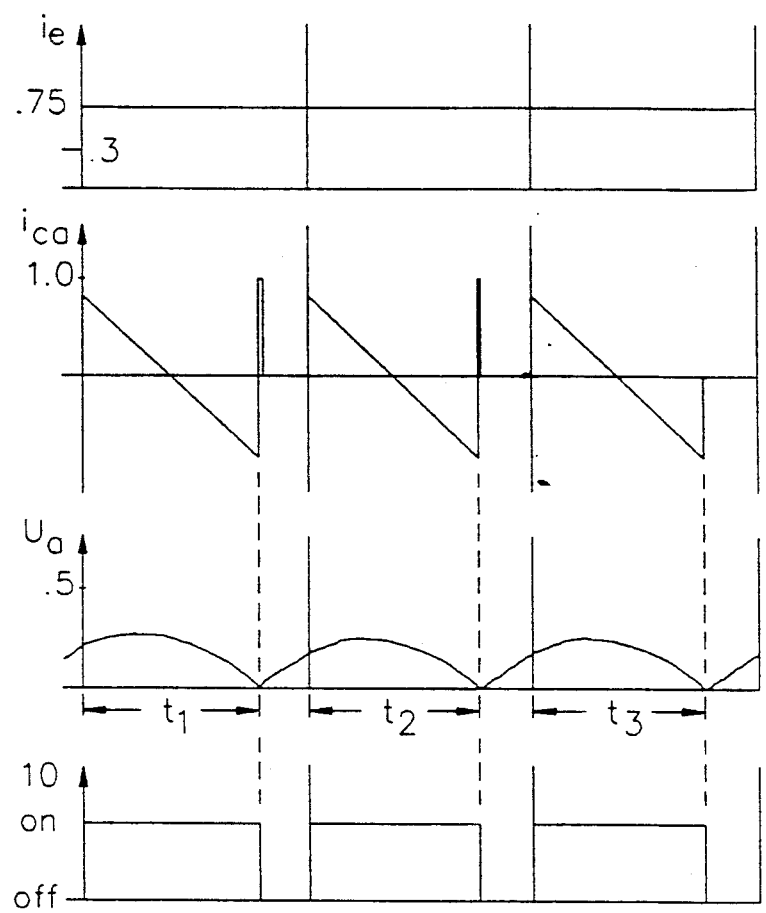
Fig.2c Timing Diagram for $i_{r1} = -1$ and $i_{r2} = 1$
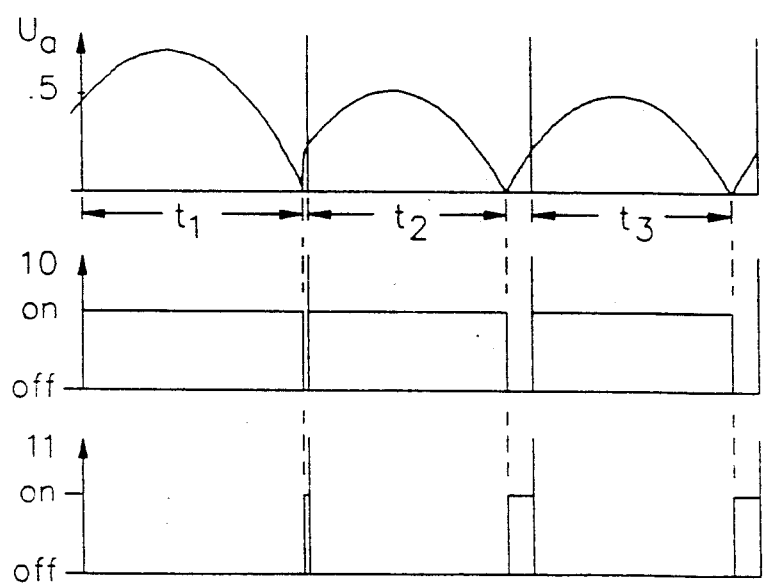

Fig.3 Logic Circuit 4
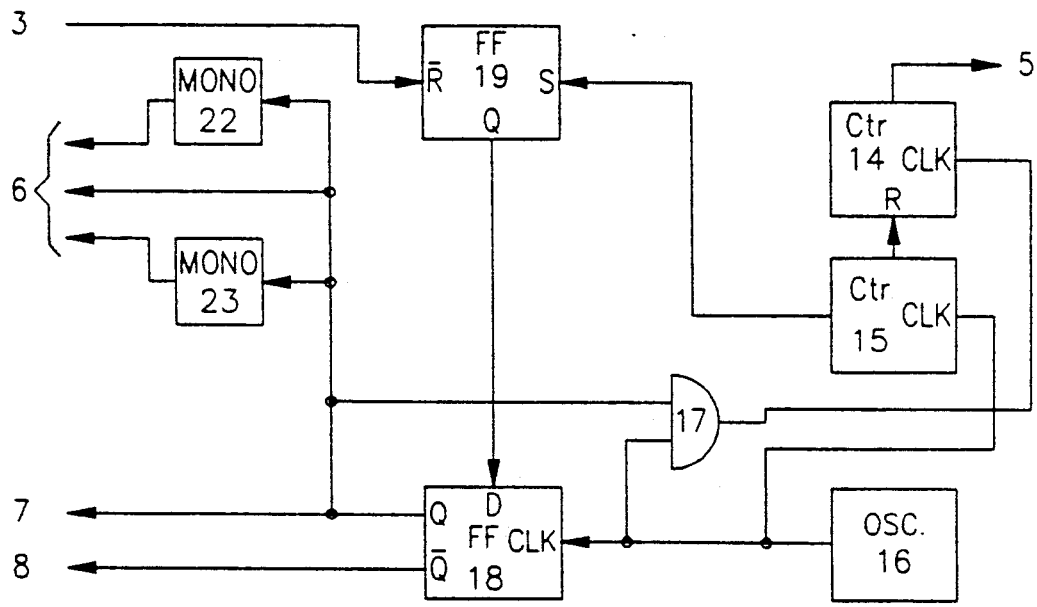

Fig.4a Construction of $i_{ca}$,12 in Fig.2a, Case (A)
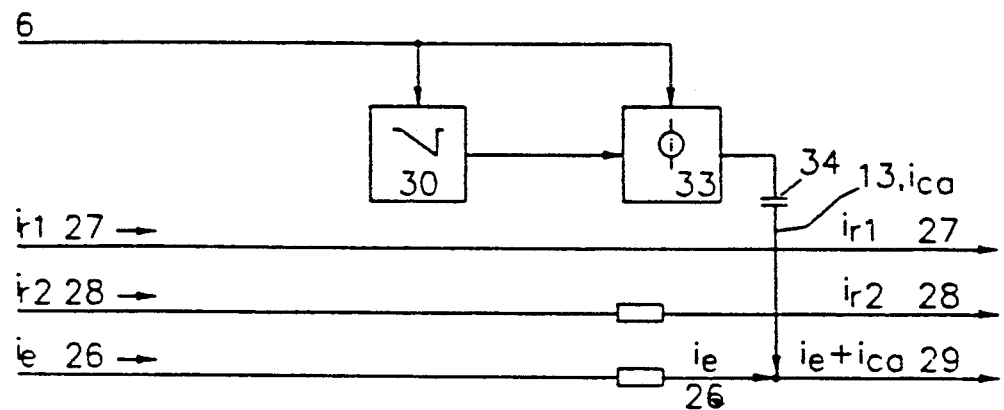
Fig.4b Construction of $i_{ca}$,12 in Fig.2a,
Cases (G), (H), dashed for (K)
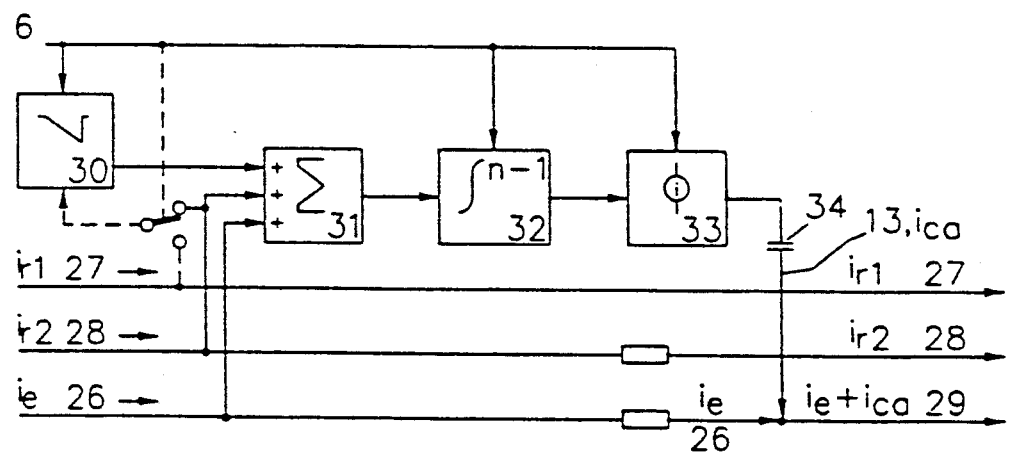
Fig.4c Construction of $i_{ca}$,12 in Fig.2a, Cases (I) and (J)
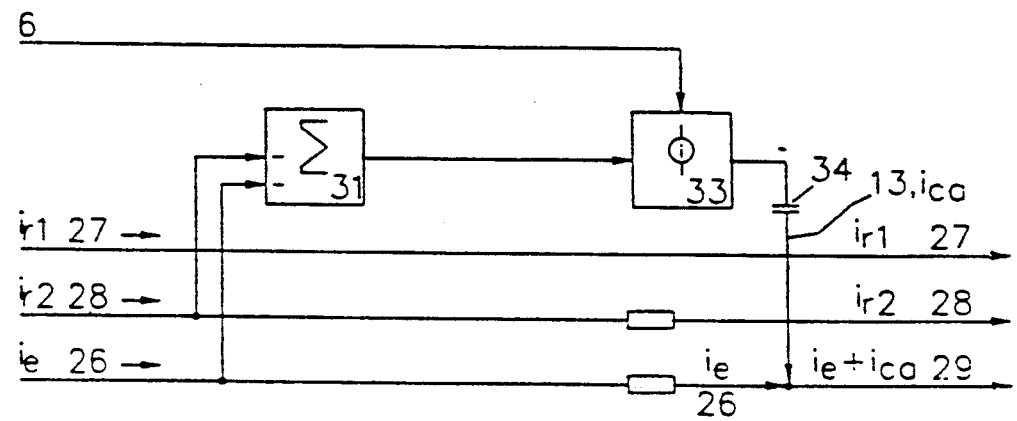

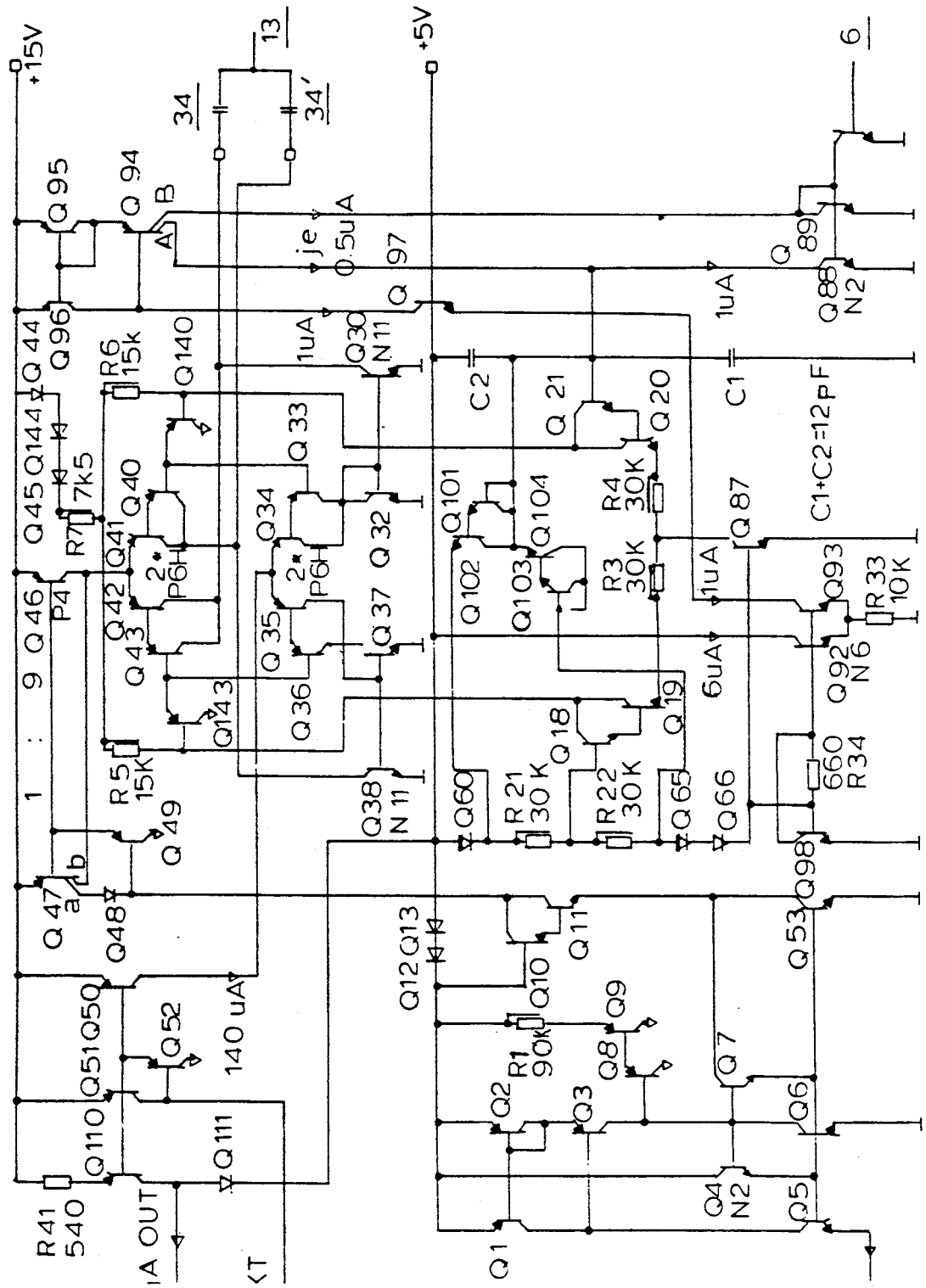
Fig.4d Implementation of a voltage controlled current source with discharging circuit 33 in an ASIC and the capacitors 34 and 34' for the case (J) with k = 0.

Fig.5a Implementation Example (K), Logic Circuit 4'
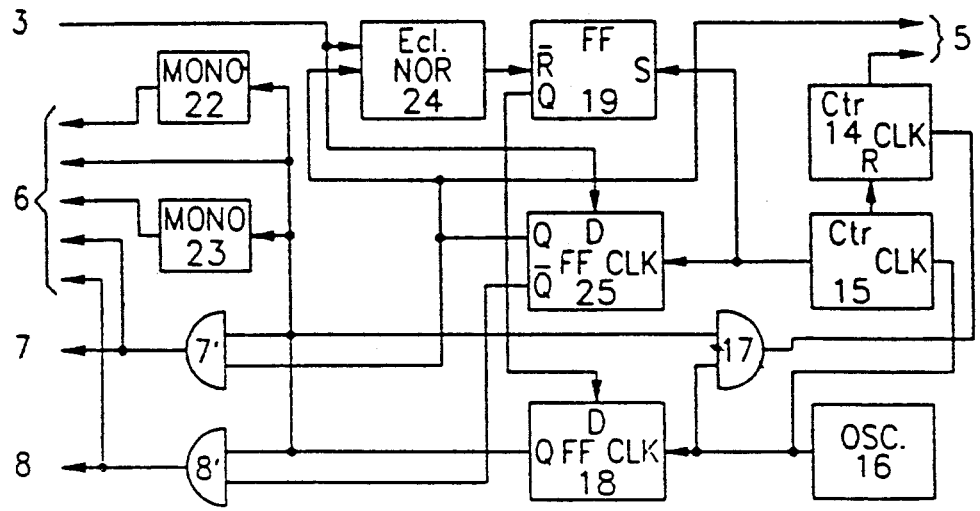
Fig.5b Implementation Example (K), Timing Diagrams
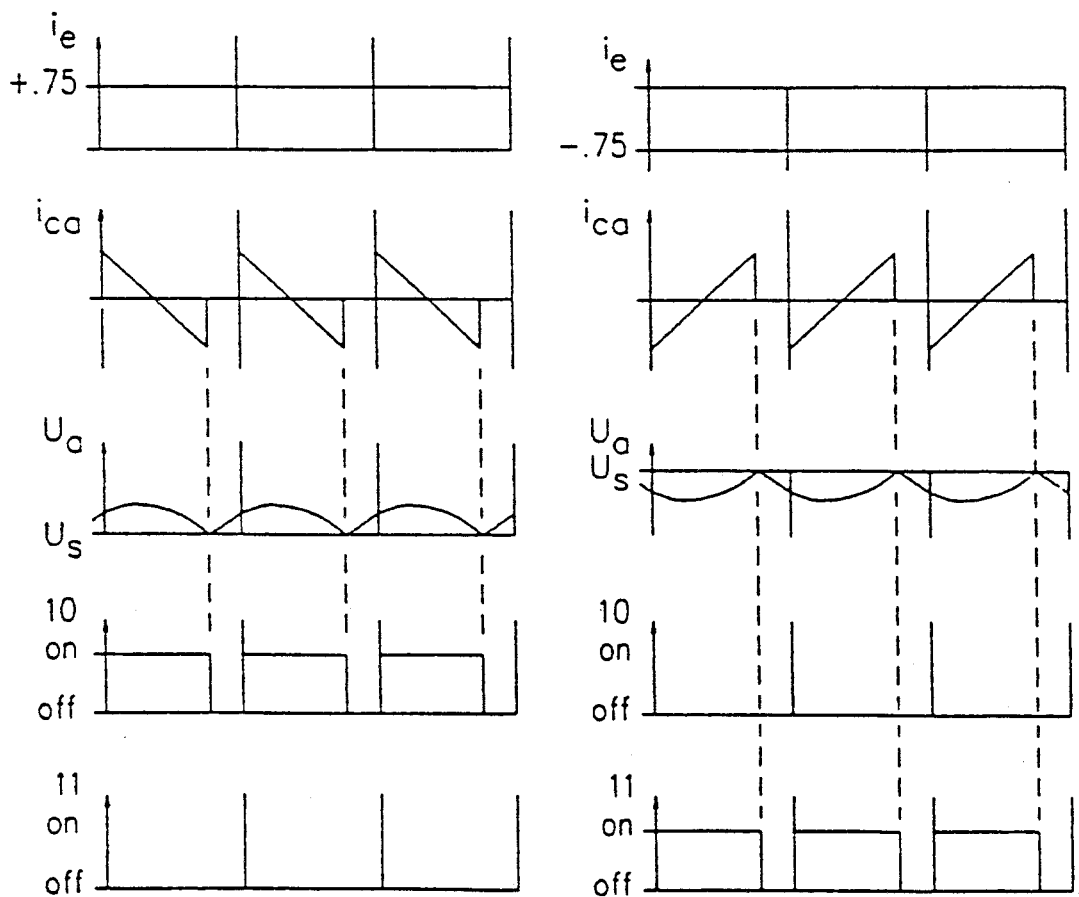

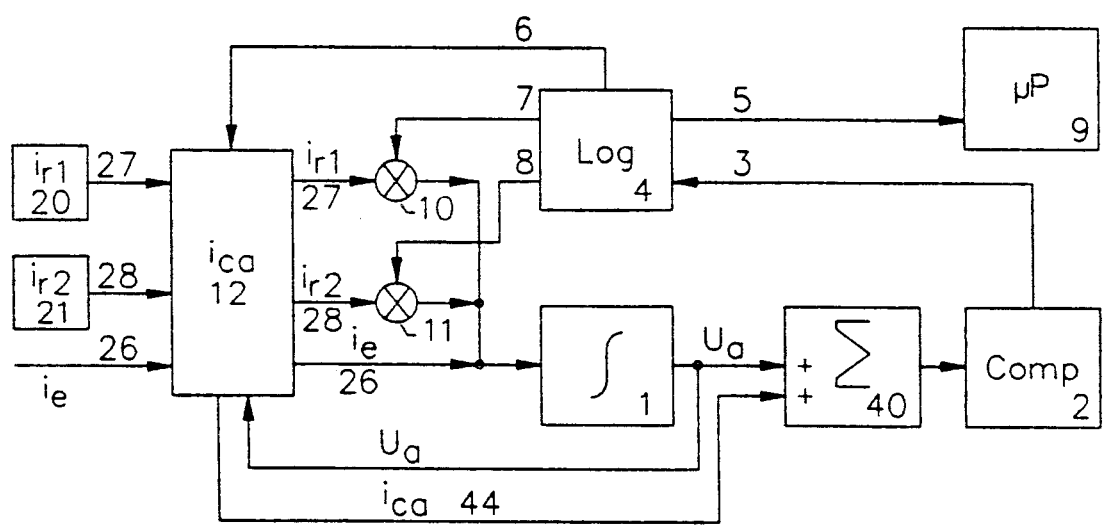
Fig.6 Block Diagram with $i_{ca}$ superimposed in $U_a$

Fig.7a $i_{ca} = (k+i_e)^2/(2(1+k)) - (1+k)^2 t/2$,
Block Diagram of an $i_{ca}$ Source 12
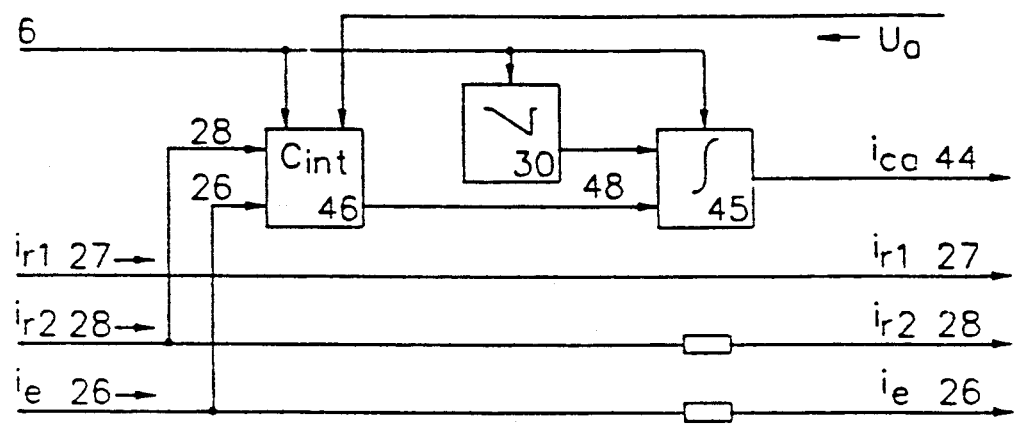
Fig.7b $i_{ca} = (k+i_e)^2/(2(1+k)) - (1+k)^2 t/2$,
Timing Diagrams for $i_e = 0.75$, $k=0$
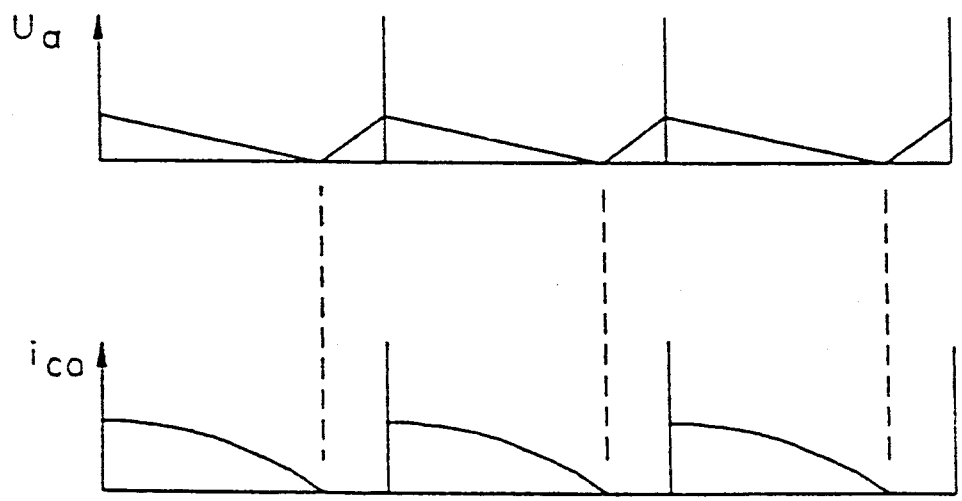

Fig.8a $i_{ca} = (k+i_e)t - (1+k)t^2$;
Block Diagram of an $i_{ca}$ Source 12
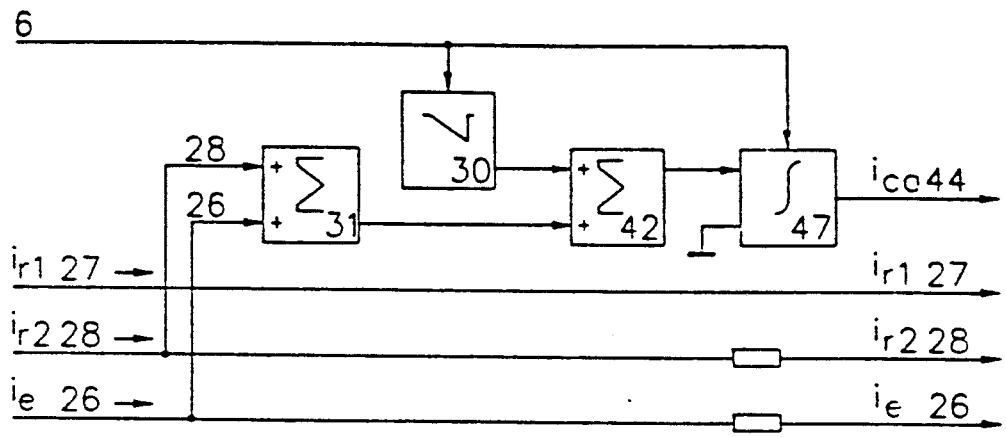
Fig.8b $i_{ca} = (k+i_e)t - (1+k)t^2$;
Timing Diagrams for i = 0.75, k = 0
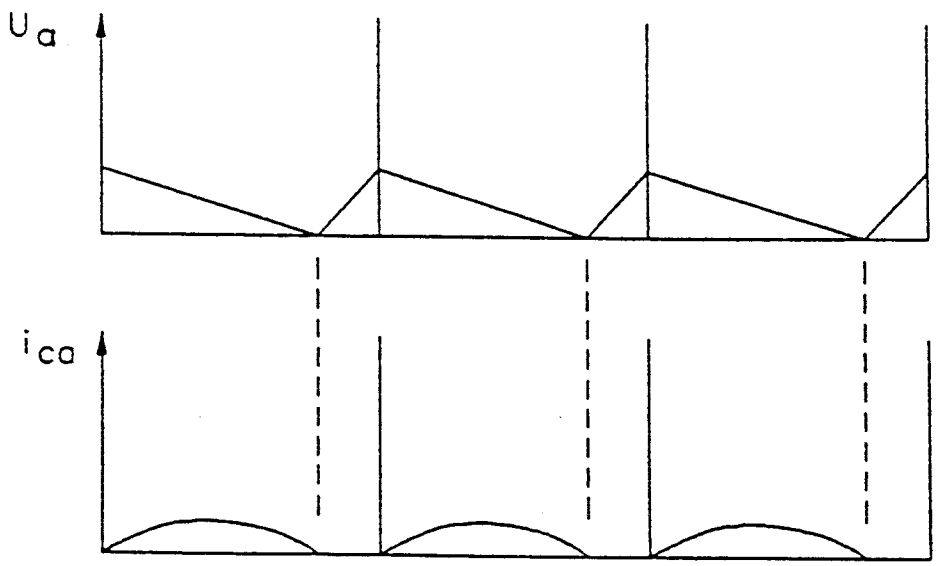

Fig.9a $i_{ca} = (k+i_e)^2/(1+k) - (i_e+k)t$,
Block Diagram of an $I_{ca}$ Source 12
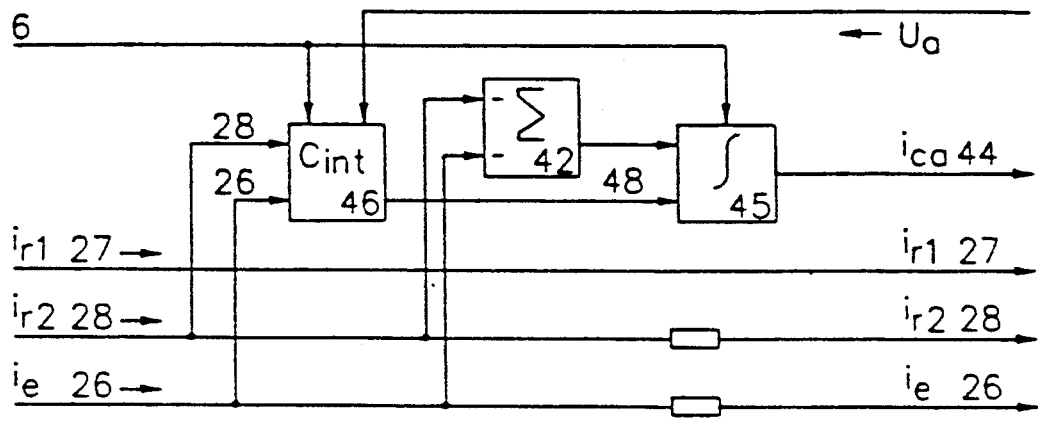
Fig.9b $i_{ca} = (k+i_e)^2/(1+k) - (i_e+k)t$,
Timing Diagrams for $i_e = 0.75$, $k = 0$
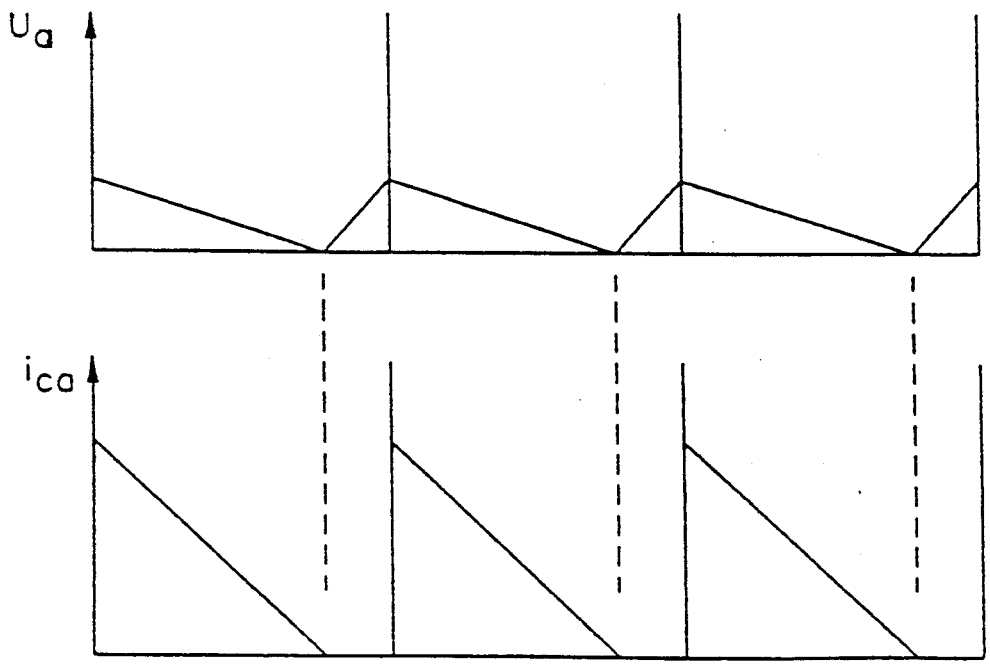

Fig.10a Possibilities for Producing the Integration Constant $C_{int}$, Using Analog Computation Elements
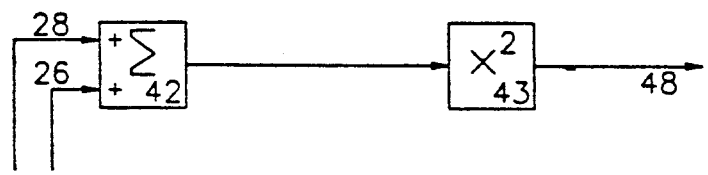
Fig.10b Possibilities for Producing the Integration Constant $C_{int}$, By Additional Up-Integration
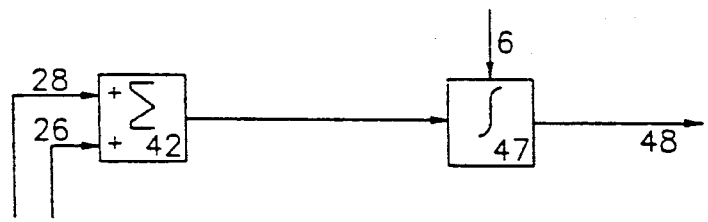
Fig.10c Possibilities for Producing the Integration Constant $C_{int}$, Derived from $i_e$, $U_a$ and k
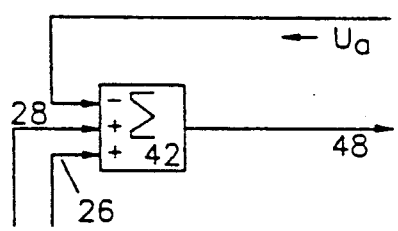

Fig.11 Comparator 2, Version with Integrating Characteristics
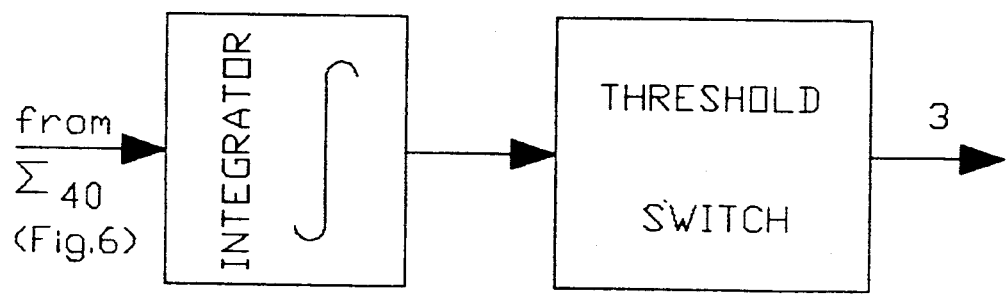

ANALOG TO DIGITAL CONVERTERS WITH CONVERGENCE ACCELERATING SIGNALS

Cross-reference to related U.S. patents by the inventors, the disclosures of which are hereby incorporated by reference: U.S. Pat. Nos. 3,765,012 and 4,361,831.

TECHNICAL FIELD

The invention involves an integrating analog to digital converter operating according to the multiple ramp procedure with a charge storage or charge summation circuit which continuously up-integrates an input signal and which with the aid of a comparator, a logic circuit and reference currents or reference voltages, down-integrates during periodically recurrent time intervals, whereby convergence accelerating signals produce a greatly enlarged convergence range and a faster convergence.

BACKGROUND OF THE INVENTION

Utilization of multiple ramp procedures for analog to digital conversion is known (U.S. Pat. Nos. 3,765,012, 4,361,831). However, in spite of all their advantages with regard to high linearity and effective interference suppression, because the input signal does not have to be switched off, easy mains frequency synchronization on account of constant conversion times and, in spite of their high accuracy and a very simple construction which can easily be integrated with the means of semiconductor technology, these procedures have the disadvantage that convergence greatly deteriorates with increasing input signal, see FIG. 1. FIG. 1a shows a block diagram of a prior art analog to digital converter which employs a multiple ramp procedure. The input signal $i_e$ is first up-integrated in a charge summation circuit 1 such as an analog integrator. The output $U_a$ is fed to a threshold comparator 2 which controls logic circuit 4. Logic circuit 4 connects, via analog switches 10 and 11, either of the integrating reference currents 20 or 21 which are of opposite polarity but have the same value, to the input signal. By alternately connecting the reference currents, one during up-integration and the other during down-integration, faster convergence times are achieved without having to switch off the input signal. A microprocessor 9 converts the up-integration time period into a digital value representative of the input signal for further processing or display. Therefore the procedures according to the U.S. Pat. Nos. 3,765,012, 4,361,831 are normally appropriate only up to ratio of approx. 0.3 for input voltage to reference signal. Even with these small ratios, the settle down transient behaviour of the analog to digital converter resulting from the rather weak convergence behaviour, can be disturbing in the case of fast measuring processes. These procedures become completely divergent when the aforementioned ratio becomes greater than 0.5. This means that the resolution must be set with a factor two to three times lower than the actual capabilities of the analog and digital hardware components.

It is the purpose of this invention to specify an analog to digital conversion method in which the advantages of the procedures specified above are retained, while at the same time eliminating their disadvantages consisting of the unfavourable settle down behaviour and restricted resolution, this without unnecessary complications for the construction, i.e. largely retaining the capability of integration in semiconductor technology.

DISCLOSURE OF THE INVENTION

The task is fulfilled according to the invention with analog to digital converters comprising a charge storage or charge summation circuit which continuously up-integrates the input signal $i_e$, followed by a comparator, a logic circuit which at periodically recurring instants defined by an oscillator, a timebase counter and a bistable stage, the time between two successive such instants being called a sub-measurement, connects via an analog switch a first reference current/voltage to the charge storage or charge summation circuit for additional integration and disconnects the previously up-integrated second reference current/voltage with the aid of a second analog switch and after a predefined number of oscillator pulse flanks after the next following passage of the output voltage of the charge storage or charge summation circuit through the comparator threshold switches off again the first reference current/voltage and the second reference current/voltage on again, a gate and a result counter contained in the logic circuit which by counting the oscillator pulses during the time in which the first or the second reference current/voltage is being up-integrated in addition to the input signal, determines a first digital value which is passed on to a measured value processing circuit, wherein a) at the input of the charge storage or charge summation circuit used for the input signal or at one of its other possible inputs, convergence accelerating signals are superimposed after every nth (n=1,2,3, ...) sub-measurement whereby the Taylor series expansions of these convergence accelerating signals according to time in the time interval of a sub-measurement are first or higher order polynomials, or b) convergence accelerating signals of the kind just described are completely or only in part as so-called partial terms in integral form, when the charge storage or charge summation circuit is an integrator, otherwise as transformation corresponding to the transformation represented by the charge storage or charge summation circuit, connected via a summation circuit together with an integration or transformation constant not equal to zero, to the same comparator input as the output voltage of the charge storage or charge summation circuit or to a similarly acting comparator input, or in inverted form to an also inverting comparator input, and that the residual terms of the aforementioned convergence accelerating signals are superimposed on the input of the charge storage or charge summation circuit used for the input signal or on one of its other inputs.

In order to explain the invention, some embodiments or implementation forms of the invention are described below; reference is made to the attached drawings.

FIGURE DESCRIPTION

The drawings show the following:

FIGS. 1a-1c illustrate a prior art A/D converter, in which

FIG. 1a shows a block diagram and FIGS. 1b and 1c specify timing diagrams for certain $i_{r1}$ and $i_{r2}$, specifically FIG. 1b for $i_{r1}=-1$ and $i_{r2}=0$, and FIG. 1c for $i_{r1}=-1$ and $i_{r2}=1$, FIGS. 2a-2c an A/D converter according to the invention, whereby FIG. 2a shows a block diagram and FIGS. 2b and 2c specify timing diagrams for certain $i_{r1}$ and $i_{r2}$, specifically FIG. 2b for $i_{r1} = -1$ and $i_{r2} = 0$, and
FIG. 2c for $i_{r1} = -1$ and $i_{r2} = 1$,
FIG. 3 a block diagram of the logic circuit 4,
FIGS. 4a–4d shows the construction of the source 12 for $i_{ca}$, specifically
FIG. 4a for the case (A),
FIG. 4b for the cases (G), (H), dashed for (K) and
FIG. 4c for the cases (I) and (J),
FIG. 4d shows the implementation of a voltage controlled current source with discharging circuit 33 in an ASIC and the discrete capacitors 34 and 34' for the case (J) with $k=0$.
FIGS. 5a–5b an implementation example for the case (K), whereby
FIG. 5a shows a block diagram for the logic circuit 4' and
FIG. 5b shows timing diagrams for $i_e = 0.75$ and for $i_e = -0.75$,
FIG. 6 the block diagram of an AD converter with $i_{ca}$ superimposed in $U_a$,
FIGS. 7a–7b $i_{ca} = (k+i_e)^2/(2(1+k)) - (1+k)^2 t/2$, whereby
FIG. 7a is a block diagram of an $i_{ca}$ source and
FIG. 7b shows timing diagrams for $U_a$ and $i_{ca}$ for $i_e = 0.75$ and $k=0$,
FIGS. 8a–8b $i_{ca} = (k+i_e)t - (1+k)t^2$, whereby
FIG. 8a is a block diagram of an $i_{ca}$ source and
FIG. 8b shows timing diagrams for $U_a$ and $i_{ca}$ for $i_e = 0.75$ and $k=0$,
FIGS. 9a–9b $i_{ca} = (k+i_e)^2/(1+k) - (i_e+k)t$, whereby
FIG. 9a is a block diagram of an $i_{ca}$ source and
FIG. 9b shows timing diagrams for $U_a$ and $i_{ca}$ for $i_e = 0.75$ and $k=0$,
FIGS. 10a–10c possibilities for producing the integration constant $C_{int}$, specifically
FIG. 10a using analog computation elements,
FIG. 10b by additional up-integration and
FIG. 10c derived from $i_e$, $U_a$ and k.
FIG. 11 comparator 2, versn. with integrating characteristics

BEST MODES FOR CARRYING OUT THE INVENTION

As shown in FIGS. 2a–2c, in the analog to digital conversion procedure of the invention, the input signal $i_e$ (current or voltage) is up-integrated continuously in a charge storage or charge summation circuit 1, whereby here and in the following the "charge storage or charge summation circuit" can be in the simplest case an analog integrator, i.e. a single integrating and inverting or non-inverting stage, or a circuit in which PID (Proportional + Integral + Derivative) sections may follow after, or be combined with a first integrator stage. After the charge storage or charge summation circuit 1 follows a comparator 2 with threshold voltage $U_S$ whose output signal 3 is taken to the logic circuit 4 in FIG. 3.

At periodically recurring instants determined by the oscillator 16, the timebase counter 15 and the bistable stage 18, the time between two successive such instants being called a sub-measurement in the following, the logic circuit 4 connects via the analog switch 10 the 1st reference current/voltage $i_{r1}$ (20) to the charge storage or charge summation circuit for additional integration, and disconnects with the aid of the analog switch 11 the previously up-integrating 2nd reference current/voltage $i_{r2}$ (21).

The next following passage of the output voltage $U_a$ of the charge storage or charge summation circuit 1 through the threshold value of the comparator 2 is latched in a bistable stage 19, FIG. 3, with the aid of the logic circuit 4 and on the nth, $n=1,2,3,\ldots$, shown in FIG. 3 for $n=1$, subsequent clock flank of the oscillator 16 produces switch-off of the 1st reference current/voltage $i_{r1}$ (20) via the bistable stage 18 and switch-on of the 2nd reference current/voltage $i_{r2}$ (21) via the analog switch 11. The 2nd reference current/voltage $i_{r2}$ (21) is now up-integrated in the charge storage or charge summation circuit 1 until the end of the sub-measurement in addition to the continuously connected input signal $i_e$.

During the time in which the 1st reference current/voltage $i_{r1}$ (20) is being additionally up-integrated in the charge storage or charge summation circuit 1, the bistable stage 18 opens the gate 17. Thus the time $t_n$, $n=1,2,3,\ldots$, is determined digitally by counting the pulses of the oscillator 16 in the result counter 14 and passed on to the measured value processing circuit 9—e.g. a computer, a microprocessor or a display—as measure for the wanted digital value, for further processing. Equivalent information would be given by the opening time of the gate 17 during the complementary time in which the 1st reference current/voltage $i_{r1}$ (20) is not being up-integrated additionally.

At the time during which these processes are taking place within one sub-measurement, under the control of the logic circuit 4, so-called convergence accelerating signals $i_{ca}$ are produced in the source for convergence accelerating signals 12 and up-integrated additionally in the charge storage or charge summation circuit 1. The convergence accelerating signals $i_{ca}$ are signals whose expansion as a Taylor series according to time in the time interval of a sub-measurement are polynomials of first or higher order. In a first implementation form, the source for convergence accelerating signals 12 is taken to be a sawtooth generator which is connected in each sub-measurement for the time in which the 1st reference current/voltage $i_{r1}$ is connected via the analog switch 10, producing a ramp proportional to $-(1+k)t$ $$i_{ca} \text{ proportional to } -(1+k)t \qquad (A)$$

Here and in the following description, t is the normalized time measured relative to the sub-measurement duration, i.e. $t=0$ at the beginning of the sub-measurement and $t=1$ at the end of the sub-measurement. For the sake of clarity and without thereby restricting general validity, it is assumed in the diagrams that the integrators and charge storage or charge summation circuits are non-inverting. In the case of inverting circuits, the output signals must be produced and further processed in correspondingly inverted form. Furthermore, all input signals and convergence accelerating signals are normalized with respect to the 1st reference current/voltage (20). Thus $i_e = 1$ means that the input signal is equal to $-i_{r1}$ the inverted 1st reference current/voltage $i_{r1}$ (20). k is defined as follows by the ratio of the references:

$$k = -i_{r2}/i_{r1}. \qquad (B)$$

If the stated proportionality (A) is equal to one, then a short calculation shows that for differentially small jumps of the input signal, $t_n$ of the next following sub-measurement immediately takes the new exact final value. For the case where $i_{r1}$ is less than $i_{r2}$, the procedure shows convergence for all $i_e$: $-k<i_e<1$. (C)

Since the contribution of the convergence accelerating signals to the integral in the charge storage or charge summation circuit 1 is known, it can be taken into account by calculation in the measured value processing circuit 9. A further implementation extension of the invention according to FIG. 4a consists of the feature that the mean value of the convergence accelerating signals is equal to zero. Among other possibilities, this can be achieved by connecting a voltage controlled current source with discharging circuit 33 after the ramp or sawtooth generator 30 and injecting the convergence accelerating signals into the charge storage or charge summation circuit 1 via a capacitor 34. For this purpose, for example, the sawtooth generator mentioned above is controlled with the aid of the logic circuit 4 such that the ramp described above is proportional to $-(1+k)t$ (A) and is stopped either on reaching the comparator threshold or at another time instant after reaching the comparator threshold and shortly before the end of the sub-measurement, and the second sawtooth flank for returning the convergence accelerating signals to zero is then started. Furthermore, for example the voltage controlled current source 33 can be controlled with the aid of the logic circuit 4 such that during the second sawtooth flank for return to zero, the capacitor 34 is discharged by an opposite polarity current or through a resistor or current limiting diode connected to ground potential. In FIG. 2b which shows the timing diagrams for the following implementation example (F) or (G), the discharging behaviour via current limiting diodes is shown in the diagram for $i_{ca}$. For the case described here with mean value zero for the convergence accelerating signals, the following value is obtained for the steady state (converged) of the converter for $t_{conv}$ on the assumption that the mean value of all charges injected into the charge storage or charge summation circuit 1 is zero:

$$t_{conv}=(k+i_e)/(1+k),\qquad (D)$$

from which follows the wanted digital value of the input signal $$i_e=t_{conv}(1+k)-k \qquad (E)$$

In another implementation of the invention the source for the convergence accelerating signals 12 is designed such that the convergence accelerating signals $i_{ca}$ 13 consist of terms which are proportional to the ramp $-2(1+k)t$ and proportional to $i_e$ and to k. (F)

Such a source for convergence accelerating signals 12 can be implemented, for example, using a ramp or sawtooth generator 30 as for (A), a weighted analog summation element 31 for addition of this ramp, $i_e$ and the constant value k followed by a voltage controlled current source 33 with discharging circuit, FIG. 4b, timing diagram FIG. 2b.

If all proportionality factors in (F) are equal to 1 for the time period during which $i_{r1}$ is connected, i.e. convergence accelerating signals $i_{ca}$ 13:

$$i_{ca}=i_e+k-2(1+k)t, \qquad (G)$$

then it holds here too that for differentially small jumps of the input signal, the $t_n$ of the next following sub-measurement immediately takes on the exact new final value. This procedure too shows convergence behaviour according to (C).

As further general implementation example for which the just discussed (G) can be considered as the special case with n=1, we will now consider the case in which the convergence accelerating signals from the source for convergence accelerating signals 12 are a polynomial of degree n, n=1,2,3,..., in t or $t=t_{conv}$ of same polarity as $i_{r1}$ and with time integral with time limits 0 to t having a zero point at or near $t_{conv}$. Generation of such a polynomial is shown for the case of negative $i_{r1}$ taking as example convergence accelerating signals $i_{ca}$ 13 proportional to:

$$i_{ca} \text{ proportional to } (t_{conv}-t(n+1)/n)t^{n-1} \qquad (H1)$$

or proportional to $$i_{ca} \text{ proportional to } ((k+i_e)/(1+k)-t(n+1)/n)t^{n-1} \qquad (H2)$$

It is possible to start from the convergence accelerating signal as for (G), with only the difference that in the analog summation element mentioned there, the ramp has a different weighting, namely in general $(n+1)/n$ instead of 2 for n=1 as in (G). The output signal of this summation element is then analog integrated $n-1$ times in the $(n-1)$-fold integrator 32 with discharging circuit, FIG. 4b.

A further implementation example with source for convergence accelerating signals 12 according to FIG. 4c uses convergence accelerating signals $i_{ca}$ 13 which are proportional to $-i_e-k$ for the time from $t=0$ until reaching the comparator threshold or until some other fixed instant before the end of the sub-measurement:

$$i_{ca} \text{ proportional to } -i_e-k. \qquad (I)$$

If all proportionality factors in (I) are equal to 1 for the time during which $i_{r1}$ is connected, i.e. convergence accelerating signals $i_{ca}$ 13:

$$i_{ca}=-i_e-k, \qquad (J)$$

then it is here in fact true that not only for differentially small jumps of the input signal but here also even for arbitrarily large jumps of the input signal, the $t_n$ of the next following sub-measurement immediately takes the exact new final value, and this even remains true over the entire convergence range (C).

The implementation examples described so far converge not only with the specified ideal proportionality factors but also still in the case of relatively large deviations therefrom. This brings the advantage that no high precision hardware components are required to build the source for convergence accelerating signals 12. In most cases it is even satisfactory here to use a standard solution which can be monolithically integrated almost completely. Thus instead of the ramp or sawtooth generator 30, in most cases even the charging and discharging curve of an RC combination is satisfactory. As example for the convergence behaviour, we now consider the implementation example according to equation (J) for a single reference, i.e. k=0. If the proportionality factor p introduced there is not 1 as was chosen for achieving immediate convergence, i.e.:

$$i_{ca} = p(-i_e - k),\quad (J1)$$

a short calculation gives for the deviation $s_n$ of $t_n$ from $t_{conv}$ defined as follows $$s_n = t_n - t_{conv},\ n = 1,2,3,\ldots,\quad (J2)$$

the relationship $$s_{n+1} = s_n(p-1)i_e/(1+(p-1)i_e).\quad (J3)$$

This shows that this implementation form of the conversion procedure converges for all $$p > 0.5\ \text{and}\ 0 < i_e < = 1 \quad (J4)$$

($<=$ stands for less than or equal to). For $0.5 < p < 1$ the deviations alternate in sign; for $p > 1$ they retain the sign of the initial deviation. In both cases they tend to the limiting value 0 with increasing n.

For a further implementation example (K) with two reference currents/voltages $i_{r1}$ and $i_{r2}$ with opposite polarity and with logic circuit 4' modified according to FIG. 5, the following describes the differences with respect to the implementation forms described so far. The procedure latches the state of the comparator 2 at the start of the sub-measurement in the bistable stage 25 and determines therefrom with the aid of the gates 7' and 8' the particular one of the two reference currents/voltages $i_{r1}$ or $i_{r2}$ whose polarity is opposite to that of the input signal $i_e$, and switches via the analog switch 10 or 11 this reference current/voltage for additional integration to the input of the charge storage or charge summation circuit.

The next following passage of the output voltage $U_a$ of the charge storage or charge summation circuit 1 through the threshold value of the comparator 2 is latched into the bistable stage 19 with the aid of the exclusive NOR gate 24 and the bistable stage 25, FIG. 5, and produces on the nth, $n=1,2,3,\ldots, n=1$ in FIG. 5, subsequent clock flank of the oscillator 16 via the bistable stage 18 immediate switch-off of the connected reference current/voltage. In contrast to the implementation forms described so far, the other reference current/voltage is not up-integrated in the charge storage or charge summation circuit 1 until the end of the sub-measurement in addition to the applied input signal $i_e$.

One of the signals already described with the equations (A), (F), (G), (H2), (I) and (J) can be used as convergence accelerating signal for $k=0$, whereby the ramps in the signals (A), (F), (G) and (H2), i.e. signal components proportional to t, have slope sign opposite to the polarity of the input signal. This can easily be achieved by not just up-integrating any constant signal to produce the ramp in the ramp or sawtooth generator 30, using instead the respective reference being used for down-integration, as shown dashed in FIG. 4b.

If the polarity of $i_e$ changes here in the course of a sequence of sub-measurements whose individual results $t_i$ are to be combined to give a final result, then the polarity of the individual results is given by the state of the bistable stage 25 of the measured value processing circuit 9. The polarity is then taken into account and the individual results are weighted differently according to (K1) and (K2) or $i_{r1}$ and $i_{r2}$ are made of equal magnitude.

Also for the implementation examples with convergence accelerating signals according to (F), (G), (H1) and (H2) the same is true as already said for the convergence accelerating signals (A): Since the contribution of the convergence accelerating signals to the integral in the charge storage or charge summation circuit 1 is known, it can be taken into account by calculation in the measured value processing circuit 9. In these as well as in the implementation examples with convergence accelerating signals according to (I) and (J), it is possible with a further extension of the invention to achieve that the mean value of the convergence accelerating signals is equal to zero. Among other ways, this can be achieved by injecting the convergence accelerating signals via a capacitor 34 into the charge storage or charge summation circuit 1. For this purpose the voltage controlled current source 33 is controlled with the aid of the logic circuit 4, for example such that the terms described with the equations specified here are switched off either on reaching the comparator threshold or at some other time instant shortly before the end of the sub-measurement and that the capacitor 34 is discharged with an opposite polarity current or through a resistor or current limiting diode connected to ground potential. It is also possible to devise solutions in which alternately to the voltage controlled current source 33 and the capacitor 34, which are used in all even sub-measurements, another voltage controlled current source 33' and another capacitor 34' are used in all odd sub-measurements.

Similarly it is possible to construct implementation examples which operate with one voltage controlled current source 33 with discharging circuit, but the latter injects the current alternately into one of two switches capacitors 34 and 34' whilst the other one is being slowly discharged at the same time. FIG. 4d shows the implementation of such a circuit in an ASIC (Application-Specific Integrated Circuit).

For the cases described as from (F) too, the equations (D) and (E) are obtained in the cases (F) to (H2) for the conversion result in the settled state of the converter. In the cases (I) and (J) and for the implementation example (K), the equation (D) follows with positive $i_e$ for $k=0$ and $i_{r1} < 0$:

$$t_{conv} = i_e \quad (K1)$$

(see explanation for $i_e$ and t according to equation (A)), and for negative $i_e$ correspondingly:

$$t_{conv} = -i_e/i_{r2}.\quad (K2)$$

The implementation forms of the invention described so far are characterized by the feature that the convergence accelerating signals $i_{ca}$ are superimposed on the input signal or on another input of the charge storage or charge summation circuit 1. Now (FIG. 6) some implementation examples will be considered in which all or some of the terms of the convergence accelerating signals are not superimposed on the input signal or on another input of the charge storage or charge summation circuit 1, but instead these terms are derived as integral if the charge storage or charge summation circuit 1 is an integrator, otherwise as transformation according to the transformation of the terms of the kind described so far according to the transformation represented by the charge storage or charge summation circuit 1. These new terms are then applied via an analog summation element 40 together with the output signal of the charge storage or charge summation circuit 1 to the input of the comparator 2. Instead of a summation circuit it is also possible to use a second comparator input with summation characteristic or a second inverting comparator input with the correspondingly inverted convergence accelerating signals. The still free integration or transformation constants after integration or transformation of the previous terms of the convergence accelerating signals, in the following description simply designated "integration constant", are chosen appropriately such that response of the comparator 2 takes place as far as possible when the output signal $U_a$ of the charge storage or charge summation circuit 1 is close to zero. The procedure is not changed in principle if other values are chosen for the integration constant. However, the result may be an unfavourable dynamic drive range for the charge storage or charge summation circuit 1. The block diagram FIG. 6 shows a possible circuit configuration of the feature just described. Here too for the sake of clarity without restricting general validity, it is assumed that the integrators and charge storage or charge summation circuits are non-inverting. If the charge storage or charge summation circuit 1 is inverting, then the convergence accelerating signals considered here must be inverted too.

FIGS. 7a-7b, together with FIG. 6 and FIGS. 10a-10c, show a preferred implementation example with the convergence accelerating signals $i_{ca}$, $$i_{ca} \text{ proportional to } (k+i_e)^2/(2(1+k)) - (1+k)t^2/2, \qquad (L)$$

These are derived here by using the integration constant described further below $$C_{int} = (k+i_e)^2/(2(1+k)) \qquad (L1)$$

at the start of the sub-measurement as starting value for the integrator stage with set input 45. This integrator stage thereafter integrates the ramp of the ramp or sawtooth generator 30 which too starts at the beginning of the sub-measurement. The convergence accelerating signals used in this implementation example correspond to the integrated ones of implementation example (A) supplemented with the integration constant $C_{int}$.

FIGS. 10a-10c show three examples for generating the integration constant $C_{int}$ used here and in the later implementation example (N). For this purpose FIG. 10a shows a simple computation circuit consisting of a weighted analog summation and difference stage 42 and an analog squaring or multiplication element 43. In the second example FIG. 10b the signals $i_e$ and $i_{r2}$ or k, after summation in the weighted analog summation and difference stage 42, are up-integrated for the duration of $t_{n-1}$ in the integrator stage with reset input 47. The result (L1) obtained in this way is then available at the beginning of $t_n$ for setting the starting value of the integrator stage with set input 45 in FIG. 7 and FIG. 9. In the third example FIG. 10c use is made of the fact on condition that a non-inverting integrator is used for the charge storage or charge summation circuit 1, that the maximum value $U_{a,max}$ of $U_a$ obeys the relationship $$U_{a,max} = (1-i_e)(k+i_e)/(1+k). \qquad (L2)$$

It follows therefrom that $$C_{int} = (-U_a + i_e + k)/2. \qquad (L3)$$

If half of this quantity is subtracted from the sum of $i_e$ and k weighted with the factor $\frac{1}{2}$ in the weighted analog summation and difference stage 42, one obtains $C_{int}$ for this and, with a weighting altogether greater by a factor of 2, $C_{int}$ for the implementation example (N) which follows later. The integration constants $C_{int}$ considered here are to be taken only as advantageous examples of numerous possible implementation forms. In cases where such ideal convergence is not so important, simpler integration constants can be chosen, for example ones which are just proportional to the input signal $i_e$.

The implementation example which follows now is shown with FIGS. 8a-8b and FIG. 6 together. For $i_{ca}$ we get here:

$$i_{ca} \text{ proportional to } (k+i_e)t - (1+k)t^2, \qquad (M)$$

with integration constant $C_{int}$:

$$C_{int} = 0. \qquad (M1)$$

According to FIG. 8a it is possible to generate $i_{ca}$ by adding together $i_e$ and $i_{r2}$ or k in the weighting analog summation circuit 31, combining the result in the weighting summation and difference circuit 42 with the ramp from the ramp or sawtooth generator 30 starting at the beginning of the sub-measurement and thereafter integrating in the integrator stage with reset input 47 as from the beginning of the sub-measurement. This implementation form is the analogy to the integrated form of the convergence accelerating signals of the implementation examples (F) and (G).

The more general case for (M) forming the analogy to (H1) or H(2) is represented by the equation $$i_{ca} \text{ proportional to } ((k+i_e)/(n(1+k)) - t/n)t_n,$$
$$n = 1,2,3,\ldots \qquad (M2)$$

For implementation of this case, an n-fold integrator stage with reset input 47' must be chosen in FIG. 8a instead of the integrator stage with reset input 47.

Due to the analogies between the implementation examples (L) and (A) as well as between (M) and (F) or (G), in the case of proportionality unity in the equations (L) and (M) and on condition that a non-inverting integrator is used for the charge storage or charge summation circuit 1, therefore immediate differential convergence again holds for both implementation examples (L) and (M), i.e. for small differential jumps of the input signal, the $t_n$ of the next following sub-measurement immediately takes the exact new final value. This holds over the entire convergence range (C).

Another preferred implementation form of the invention is shown in FIGS. 9a-9b, together with FIG. 6 and FIGS. 10a-10c. Here the convergence accelerating signals $i_{ca}$ have the form $$i_{ca} \text{ proportional to } (i_e+k)^2/(1+k) - (i_e+k)t, \qquad (N)$$

which can be obtained by integrating the equations (I) or (J). The integration constant $$C_{int} = (i_e+k)^2/(1+k) \qquad (N1)$$

is added after the integration.

$i_{ca}$ according to FIG. 9a can be produced, for example, by letting the integrator stage with set input 45, which starts with $C_{int}$ at the beginning of the sub-measurement, integrate the inverted sum of $i_e$ and $i_{r2}$ or k which is formed in the weighting analog summation and difference circuit 42.

If here $$i_{ca}=(i_e+k)^2/(1+k)-(i_e+k)i, \qquad (N2)$$

then on condition that a non-inverting integrator is used for the charge storage or charge summation circuit 1, it is true as for (J) that even for arbitrarily large jumps of the input signal the $t_n$ of the next following sub-measurement immediately takes the exact new final value, this indeed in the entire convergence range (C).

The circuit diagrams according to FIG. 6 to 10 each show only one of several conceivable implementation possibilities. Thus interchangeable mathematical operations occurring in the equation (L) to (N1) can also be interchanged in the electronic implementation. For example, instead of setting an integrator stage with set input 45 to a starting value of $C_{int}$, it can be reset to zero and then $C_{int}$ can be added to its output signal with the aid of an addition circuit. Or instead of integrating the combination of the ramp of the ramp or sawtooth generator 30 and $i_e+k$ in the integrator stage with reset input 47 according to FIG. 8, these integrations can also be performed separately in different integrators and the results then combined to give $i_{ca}$. The preferred implementation examples (L), (M) and (N) can of course also be realized using an inverting integrator for the charge storage and charge summation circuit 1 by also inverting the $i_{ca}$, It is even possible to devise mixed forms between the implementation examples (A) to (K) and their analogues (L) to (N), by superimposing one or several terms in non-integrated form as for (A) to (K) on the input signal $i_e$ and superimposing the other terms as for (L) to (N) on the output signal $U_a$ in integrated form.

The implementations of the logic circuits 4 or 4' as shown in FIG. 3 and 5a should in each case be understood as only one of several conceivable possibilities. Thus other flip-flop and gate types can be used and, for example, the result counter 14 can be eliminated, using instead a set of latches to take over the count state of the timebase counter 15 at each count end instant of the result counter 14. Or instead of $t_n$ the respective complementary time until the end of the sub-measurement can be counted. Furthermore, the entire logic circuits 4 or 4' can be implemented with a microprocessor, using the peripheral counter, latch, trigger, interrupt and comparator facilities often found on the same chip or in auxiliary integrated circuits under hardware or software control or emulating the entire logic circuit including the counter stages by software. The measured value processing circuit 9 can then be accommodated too in such a microprocessor.

Further implementation forms are conceivable in which in each lth sub-measurement, l=1,2,3, . . . , on passage of the output signal $U_a$ through the comparator threshold voltage $U_S$, the currently connected reference current/voltage is switched off not synchronized to the oscillator but instead synchronized with or with constant delay in relation to the comparator output signal. Furthermore, implementation forms exist in which the convergence accelerating signals $i_{ca}$ are not superimposed during every sub-measurement but only during every nth sub-measurement, n=1,2,3, . . . ,. There are also implementations of the invention in which the sub-measurements take fixed predefined values for a sequence of sub-measurements but these values are different for the individual sub-measurements of this series.

There are also implementation forms of the invention in which a constant signal is superimposed by addition or subtraction on the input signal which is to be digitized. Constant need not necessarily imply a direct voltage. It could be extended to include convergence accelerating signals $i_{ca}$ whose time average is a constant. The timing of these signals can coincide with a) the entire sub-measurement, b) the down-integration time with $i_{r1}$, c) the rest of the sub-measurement time after the end of the down-integration, or d) the entire time between the end of one down-integration and the end of the next one. This constant signal is then taken into account, as too in the following implementation, by calculatory subtraction/addition in the measured value processing circuit 9. The other case is the one in which reference currents/voltages are switched on or off for constant defined time intervals or with constant delay time, for example in order to tide over finite settle times of amplifiers.

Additional implementation forms of the invention exist in which for the same reasons as just mentioned, the input signal is switched off for constant time intervals alone or in addition to the measures described above. This can be taken into account in the measured value processing circuit by multiplying the conversion result by a constant factor.

In the implementations described so far, it sufficed for the function to take a simple threshold switch with threshold level $U_S$ as comparator 2. Further preferred implementations of the invention use instead a comparator 2 with integrating characteristics, e.g. a combination consisting of an integrator followed by a threshold switch, FIG. 11. When all or at least some of the terms of the convergence accelerating signals are superimposed on the output signal $U_a$ of the charge storage or charge summation circuit 1, e.g. according to FIG. 6, they can be chosen entirely or partly proportional to $i_{r1}$ in this implementation. This is a good implementation with regard to minimizing noise, especially together with the digital filtering mentioned below.

Further implementation forms of the invention have in addition and with inputs parallel to the comparator 2 another comparator for overdrive prevention 2' with a switching threshold chosen to lie so high that in the case of non-ideal choice of convergence accelerating signals and a large jump of the input signal, imminent overdrive of the charge storage or charge summation circuit 1 is reported to the logic circuit 4, which then prematurely before the actual start of the next sub-measurement connects the 1st reference current/voltage $i_{r1}$ (20) via the analog switch 10 to the charge storage or charge summation circuit 1, for up or down integration, and at the same time switches off the previously up-integrating 2nd reference current/voltage $i_{r2}$ (21) via the analog switch 11. Furthermore, implementation forms exist in which the maximum switch-on time of the 1st reference current/voltage $i_{r1}$ (20) is limited to a maximum duty cycle, for example 0.95. This ensures adequate time for take-over of the measured value by the measured value processing circuit 9 and achieves at the same time that all switches are actuated the same number of times in every sub-measurement. This is also of interest in the case of non-ideal choice of convergence accelerating signals and a large input signal jump.

The measured value processing circuit 9 processes the individual conversion results $t_n$ of one sub-measurement. For example, it can make a zero point correction for this $t_n$, followed by multiplication with a scaling factor and output of the result. It can also produce a final result with high resolution over several sub-measurements using moving or in each case individual addition of the individual results over these sub-measurements. Furthermore, it can also be configured such that, to obtain a high order filter characteristic and also to achieve higher resolution, it performs a moving and according to the sub-measurement sequence differently weighted addition of the results of individual measurements. The measured value processing circuit 9 can also achieve a high order filter characteristic and increased resolution by cascading several moving average generators, i.e. using a first moving average generator to output an averaged result over m, m>=n, sub-measurements every n, n=1,2,3, . . , sub-measurements and processing these averaged individual conversion results $t_n$ for a sub-measurement have been processed by the measured value processing circuit 9 in one or several of the ways described, they are available at the output of the measured value processing circuit 9 for display, recording, control functions or other purposes.

Specification of Circuits

Alternatives to integration into an IC

A suitable charge storage or charge summation circuit 1 or the integrator part of FIG. 11 is model no. OP-77E manufactured or sold by Precision Monolitics Inc. with its output fed back to its inverting input by a capacitor.

A suitable comparator 2, 2' with threshold value $U_S$ is model no. LM311 manufactured or sold by National Semiconductor Corp.

A suitable measured value processing circuit 9 is any model of a programmable micro processor.

Suitable result counter 14 and timebase counter 15 are several series-connected model no. MM74HC161 manufactured or sold by National Semiconductor Corp.

A suitable oscillator 16 is model no. SG-615/615P manufactured or sold by Seiko Epson Corp., Japan Suitable bistable stages are model no. MM74HC76 manufactured or sold by National Semiconductor Corp.

A suitable ramp or sawtooth generator 30 is model no. LM555 manufactured or sold by National Semiconductor Corp., (s. schematic in Linear Databook 3, Rev.1, p. 5-38 ff).

Suitable summation circuits 31, 40 are model no. OP-77E manufactured or sold by Precision Monolitics Inc. with their output fed back to their inverting input by a resistor.

Suitable integrators 32 ((n−1)fold), 45, 47 are model no. OP-77E manufactured or sold by Precision Monolitics Inc. with their output fed back to their inverting input by a capacitor, and with the possibility to (dis-)charge the capacitor to a predefined value via suitable analog switches, e.g. model no. DG308A manufactured or sold by Siliconix Corp..

LEGEND

Systematic glossary of the terms used in the description and explanation of the reference symbols used in the drawings.

1—Charge storage or charge summation circuit
2—Comparator with threshold value $U_S$
2'—Comparator for overdrive prevention
3—Line with comparator output voltage
4—Logic circuit
4'—Logic circuit
5—Lines for transmission of the conversion result
6—Control lines for convergence accelerating signals
7—Analog switch control line for analog switch 10
7'—Control gate for 10
8—Analog switch control line for analog switch 11
8'—Control gate for 11
9—Measured value processing circuit '10—Analog switch for 1st reference current/voltage $i_{r1}$ (20)
11—Analog switch for 2nd reference current/voltage $i_{r2}$ (21)
12—Source for convergence accelerating signals $i_{ca}$
13—Convergence accelerating signals $i_{ca}$ or line with
14—Result counter
15—Timebase counter
16—Oscillator
17—Gate
18—Bistable stage
19—Bistable stage
20—Source for 1st reference current/voltage $i_{r1}$
21—Source for 2nd reference current/voltage $i_{r2}$
22—Monoflop triggered by positive flank
23—Monoflop triggered by negative flank
24—Exclusive NOR gate
25—Bistable stage
26—Line with input signal $i_e$
27—Line with 1st reference current/voltage $i_{r1}$
28—Line with 2nd reference current/voltage $i_{r2}$
29—Line with superimposed input signal $i_e$ and convergence accelerating signal $i_{ca}$
30—Ramp or sawtooth generator
31—Weighting analog summation circuit
32—(n−1)fold integrator with discharging circuit
33—Voltage controlled current source with discharging circuit
33'—Further voltage controlled current source with discharging circuit
34—Capacitor
34'—Further capacitor
40—Analog summation circuit
42—Weighting analog summation and difference circuit
43—Analog squaring circuit
44—Line with convergence accelerating signals $i_{ca}$
45—Integrator stage with set input
46—Integration constant generator $C_{int}$
47—Integrator stage with reset input
48—Signal line for the integration constant
$U_a$—Output voltage of the charge storage or charge summation circuit 1 or the corresponding line in the block diagrams

We claim:

1. Analog to digital converter comprising a charge storage or charge summation circuit which continuously up-integrates the input signal $i_e$, followed by a comparator, a logic circuit which at periodically recurring instants defined by an oscillator, a timebase counter and a bistable stage, the time between two successive such instants being called a sub-measurement, connects via an analog switch a first reference current/voltage to the charge storage or charge summation circuit for additional integration and disconnects the previously up-integrated second reference current/voltage with the aid of a second analog switch and after a predefined number of oscillator pulse flanks after the next following passage of the output voltage of the charge storage or charge summation circuit through the comparator threshold switches off again the first reference current- /voltage and the second reference current/voltage on again, a gate and a result counter contained in the logic circuit which by counting the oscillator pulses during the time in which the first or the second reference current/voltage is being up-integrated in addition to the input signal, determines a first digital value which is passed on to a measured value processing circuit, wherein at the input of the charge storage or charge summation circuit used for the input signal or at one of its other inputs, convergence accelerating signals are superimposed after every nth (n=1,2,3, ... ) sub-measurement whereby the Taylor series expansions of these convergence accelerating signals according to time in the time interval of a sub-measurement are first or higher order polynomials.

2. Analog to digital converter according to claim 1, wherein the two reference currents/voltages have opposite polarity, at the periodically recurring instants in each case the reference current/voltage of polarity opposite to the polarity of the input signal is connected by the logic circuit via the corresponding analog switch, but the other is not connected.

3. Analog to digital converter according to claim 2, wherein the convergence accelerating signals are a function of the time t and/or of the input signal.

4. Analog to digital converter according to claim 3, wherein the convergence accelerating signals also contain components from derivatives and integrals of the input signal of any order.

5. Analog to digital converter according to claim 1, wherein the digital conversion result is corrected digitally by the magnitude of the convergence accelerating signals.

6. Analog to digital converter according to claim 1, wherein the mean value of the convergence accelerating signals is zero.

7. Analog to digital converter according to claim 6, wherein the convergence accelerating signals are injected capacitively.

8. Analog to digital converter according to claim 6, wherein the convergence accelerating signals during the down integration with the reference current/voltage connected at the start of the sub-measurement consist of terms proportional to the input signal, terms proportional to the references and terms proportional to the time elapsed since the beginning of the sub-measurement.

9. Analog to digital converter according to claim 8, wherein the resulting proportionality factor for the time elapse since the beginning of the sub-measurement is negative.

10. Analog to digital converter according to claim 8, wherein the resulting proportionality factors for the input signal and for the 2nd reference are positive and the resulting proportionality factor for the time elapse since the beginning of the sub-measurement is negative.

11. Analog to digital converter according to claim 8, wherein the aforementioned convergence accelerating signals are multiplied additionally by factors proportional to the nth power of the time elapse since the beginning of the sub-measurement, n=1,2,3, ...

12. Analog to digital converter according to claim 8, wherein the resulting proportionality factor for the input signal is negative and the resulting proportionality factor for the time elapse since the beginning of the sub-measurement is zero.

13. Analog to digital converter comprising a charge storage or charge summation circuit which continuously up-integrates the input signal $i_e$, followed by a comparator, a logic circuit which at periodically recurring instants determined by an oscillator, a timebase counter and a bistable stage, the time between two successive such instants being called a sub-measurement, connects via an analog switch a first reference current/voltage to the charge storage or charge summation circuit for additional integration and switches off the previously up-integrated second reference current/voltage with the aid of a second analog switch and, after a predefined number of oscillator pulse flanks after the next following passage of the output voltage of the charge storage or charge summation circuit through the comparator threshold value disconnects the first reference current/voltage again and connects the second reference current/voltage again, a gate and a result counter contained in the logic circuit which by counting the oscillator pulses in the time during which the first or the second reference current/voltage is being up-integrated in addition to the input signal, determines a first digital value which is passed on to a measured value processing circuit, wherein for every nth (n=1,2,3, ... ) sub-measurement convergence accelerating signals, whereby the Taylors series expansions of these convergence accelerating signals according to time in the time interval of a sub-measurement are first or higher order polynomials, are completely or only in part as so-called partial terms in integral form, if the charge storage or charge summation circuit is an integrator, otherwise as transformation corresponding to the transformation constituted by the charge storage or charge summation circuit, connected via a summation circuit to the same comparator input as the output voltage of the charge storage or charge summation circuit or to a similarly acting comparator input or in inverted form to an inverting or opposite phase comparator input, and that the residual terms of the aforementioned convergence accelerating signals are superimposed on the input of the charge storage or charge summation circuit used for the input signal or on one of its other inputs, all this on condition that the signs of the second derivative of the sum of these integrated or transformed partial terms and the first derivative of the integrated or transformed input signal a) are opposite when using the same comparator input for the integrated or transformed partial terms as for the output voltage of the charge storage or charge summation circuit or b) are the same when using opposite phase comparator inputs for the signals specified under a).

14. Analog to digital converter comprising a charge storage or charge summation circuit which continuously up-integrates the input signal $i_e$, followed by a comparator, a logic circuit which at periodically recurring instants defined by an oscillator, a timebase counter and a bistable stage, the time between two successive such instants being called a sub-measurement, connects via an analog switch a first reference current/voltage to the charge storage or charge summation circuit for additional integration and disconnects the previously up-integrating second reference current/voltage with the aid of a second analog switch, and after a predefined number of oscillator pulse flanks after the next following passage of the output voltage of the charge storage or charge summation circuit through the comparator threshold value, disconnects the first reference current/voltage again and connects the second reference current/voltage again, a gate and a result counter contained in the logic circuit which, by counting the oscillator pulses in the time during which the first or the second reference current/voltage is being up-integrated in addition to the input signal, determines a first digital value which is passed on to a measured value processing circuit, wherein for every nth (n=1,2,3, ...) sub-measurement convergence accelerating signals, whereby the Taylors series expansions of these convergence accelerating signals according to time in the time interval of a sub-measurement are first or higher order polynomials, are completely or only in part as so-called partial terms in integral form, when the charge storage or charge summation circuit is an integrator, otherwise as transformation corresponding to the transformation represented by the charge storage or charge summation circuit, connected via a summation circuit together with an integration or transformation constant not equal to zero, to the same comparator input as the output voltage of the charge storage or charge summation circuit or to a similarly acting comparator input, or in inverted form to an also inverting comparator input, and that the resitual terms of the aforementioned convergence accelerating signals are superimposed on the input of the charge storage or charge summation circuit used for the input signal or on one of its other inputs.

15. Analog to digital converter according to claim 14, wherein the integration constant is chosen proportional to the square of the sum of the 2nd reference current/voltage and the input signal $i_e$ divided by $1+k$ ($k=$2nd reference current/voltage divided by the inverted 1st reference current/voltage), the magnitudes of both in each case being taken as ratio with respect to the 1st reference current/voltage, this for the case that the charge storage or charge summation circuit consists of a single integrating stage, otherwise the same additional conditioning holds for the integration constant as for the input signal in the charge storage or charge summation circuit.

16. Analog to digital converter according to claim 15, wherein the integration constant is produced by analog addition and multiplication circuits.

17. Analog to digital converter according to claim 15, wherein the integration constant is obtained by additional up-integration of the sum of the 2nd reference current/voltage and the input signal for the duration of the down-integration for the previous sub-measurement.

18. Analog to digital converter according to claim 15, wherein the integration constant is derived from the input signal with subtraction of the weighted output signal of the first integrator stage of the charge storage or charge summation circuit or of a separate integrator circuit with the same function, plus a constant term.

19. Analog to digital converter according to claim 14, wherein the convergence accelerating signals applied to the comparator input during the time interval of down-integration with the reference current/voltage connected at the beginning of the sub-measurement, is proportional to a polynomial in t, t being the time elapse since the beginning of the sub-measurement, and that the polynomial has a zero point close to the time instant of the end of the down-integration and possibly a second zero point at or close to the beginning of the sub-measurement.

20. Analog to digital converter according to claim 19, wherein the polynomial of the convergence accelerating signals consists of terms which are proportional to $(k+i_e)^2/(2(1+k))$ and to $-(1+k)t^2/2$.

21. Analog to digital converter according to claim 19, wherein the polynomial of the convergence accelerating signals consists of terms which are proportional to $(k+i_e)t^n$ and to $-(1+k)t^{n+1}$ where $n=0,1,2,\ldots$.

22. Analog to digital converter according to claim 13 or 14, wherein the convergence accelerating signals are proportional to $-(i_e+k)t$ plus an integration constant, in the time interval of the down-integration with the reference current/voltage connected at the beginning of the sub-measurement.

23. Analog to digital converter according to claim 1, 13 or 14, wherein a final result with high resolution is obtained a) by individual or respectively weighted or unweighted moving addition of the individual results of m (m=1,2,3, ...) sub-measurements or b) by processing the results of individual sub-measurements in a cascaded connection of several moving summation generators.

24. Analog to digital converter according to claim 1, 13 or 14, but wherein every lth sub-measurement (l=1,2,3, ...) the down-integration with the reference current connected at the beginning of the sub-measurement is switched off at the same time as the next following change of the comparator output signal or with constant delay time with respect thereto.

25. Analog to digital converter according to claim 1, 13 or 14, wherein the convergence accelerating signals are superimposed only in every nth sub-measurement (n=1,2,3, ...).

26. Analog to digital converter according to claim 1, 13 or 14, wherein the sub-measurement duration for a sequence of sub-measurements takes fixed predefined values, but the values differ for the individual sub-measurements of this sequence.

* * * * *